(12) United States Patent
Bacallao

(10) Patent No.: US 10,123,645 B2
(45) Date of Patent: Nov. 13, 2018

(54) HANGER DEVICE AND KEY HOLDER

(71) Applicant: Wal-Mart Stores, Inc., Bentonville, AR (US)

(72) Inventor: Yurgis Mauro Bacallao, Centerton, AR (US)

(73) Assignee: WALMART APOLLO, LLC, Bentonville, AR (US)

( * ) Notice: Subject to any disclaimer, the term of this patent is extended or adjusted under 35 U.S.C. 154(b) by 0 days.

(21) Appl. No.: 15/702,831

(22) Filed: Sep. 13, 2017

(65) Prior Publication Data

US 2018/0084936 A1 Mar. 29, 2018

Related U.S. Application Data

(60) Provisional application No. 62/400,814, filed on Sep. 28, 2016.

(51) Int. Cl.
| | |
|---|---|
| *H05K 5/00* | (2006.01) |
| *A47G 29/10* | (2006.01) |
| *F16M 13/02* | (2006.01) |
| *A47G 25/06* | (2006.01) |
| *F16B 45/00* | (2006.01) |

(52) U.S. Cl.
CPC ......... *A47G 29/10* (2013.01); *A47G 25/0614* (2013.01); *F16M 13/02* (2013.01); *H05K 5/0017* (2013.01); *F16B 45/00* (2013.01); *H05K 5/00* (2013.01)

(58) Field of Classification Search
None
See application file for complete search history.

(56) References Cited

U.S. PATENT DOCUMENTS

| | | | | |
|---|---|---|---|---|
| 5,487,517 A * | 1/1996 | Smith | ............... | A47G 7/044 248/215 |
| 5,594,419 A * | 1/1997 | Lo | ............... | A47G 29/083 248/339 |
| 5,797,527 A * | 8/1998 | Lam | ............... | A47G 25/0607 223/85 |
| 6,267,257 B1 * | 7/2001 | DeBruyn | ............... | A47G 25/06 211/106 |

(Continued)

FOREIGN PATENT DOCUMENTS

| | | |
|---|---|---|
| CN | 201517606 U | 6/2010 |
| CN | 105338850 A | 2/2016 |
| KR | 200339913 Y1 | 1/2004 |

*Primary Examiner* — Courtney Smith
*Assistant Examiner* — Rashen E Morrison
(74) *Attorney, Agent, or Firm* — Schmeiser, Olsen & Watts LLP

(57) ABSTRACT

Described is a hanger device and key holder. The key holder is coupled to the hanger device and includes a key ring for holding keys. The hanger device is configured for office use by coupling to the top of an office divider wall. The hanger device is both a coat hanger for hanging apparel and a key holder for holding keys. The hanger device has several common office use electronic devices integrated into the hanger device, such as a laser pointer, a remote access device, and a portable memory device. The hanger device has a battery to feed the included electronic devices and a display to provide data and information related to the electronic devices. The hanger device provides functions needed by office workers and helps keep items used by office workers from getting lost.

14 Claims, 8 Drawing Sheets

(56) References Cited

U.S. PATENT DOCUMENTS

| | | | | |
|---|---|---|---|---|
| 6,302,365 | B1 * | 10/2001 | Catanzarite | A47G 25/0614 248/215 |
| 6,364,260 | B1 * | 4/2002 | Lorincz | A47B 96/06 211/113 |
| 6,749,165 | B2 * | 6/2004 | Immerman | A47G 1/17 248/205.5 |
| 6,814,335 | B2 * | 11/2004 | Immerman | A47G 1/17 248/205.5 |
| D573,449 | S | 7/2008 | Goodman et al. | |
| 7,468,665 | B2 * | 12/2008 | Grundy | A45C 13/24 340/568.1 |
| 7,847,692 | B2 * | 12/2010 | Schuller | G08B 25/10 248/346.03 |
| 2003/0173483 | A1 * | 9/2003 | Yeh | A47G 7/044 248/287.1 |
| 2007/0205346 | A1 * | 9/2007 | Jackson | A47G 25/0614 248/307 |
| 2011/0049200 | A1 | 3/2011 | Rodberg | |
| 2011/0114806 | A1 | 5/2011 | Losaw | |
| 2014/0042287 | A1 | 2/2014 | Stein et al. | |
| 2015/0272364 | A1 * | 10/2015 | Larsen | G09F 9/313 223/96 |

* cited by examiner

US 10,123,645 B2

HANGER DEVICE AND KEY HOLDER

CROSS REFERENCE TO RELATED APPLICATION

This invention claims priority to U.S. provisional patent application Ser. No. 62/400,814, filed Sep. 28, 2016 to Applicant Wal-Mart Stores Inc., and entitled "Coat Hanger Device and Key Chain", which is incorporated entirely herein by reference.

BACKGROUND OF THE INVENTION

Technical Field

This invention relates to hanger devices, and specifically to a coat hanger device configured for office use that combines several common office use items into the coat hanger device, such as a key chain, a laser pointer, and a portable memory device.

State of the Art

Office workers often own a number of items for use in their office. They often have an electronic access device, a portable memory device, and a laser pointer, for example. Office workers also usually need a place to hang their coat, and a place to put their keys. It is desirable to have one device that can meet a number of these needs.

Accordingly, what is needed is a coat hanger and key chain device that integrates multiple office use functionalities into one device.

DETAILED DESCRIPTION OF EMBODIMENTS OF THE INVENTION

As discussed above, embodiments of the present invention relate to hanger devices, and specifically to a coat hanger device configured for office use that combines several common office use items into the hanger device, such as a key chain, a laser pointer, and a portable memory device. Office workers regularly carry a number of common items with them back and forth from home to office, such as keys and a coat or jacket, for example. When they get to work, they need a place to hang their jacket and their keys. Office workers also regularly use a number of devices while at the office, such as a remote access device, a laser pointer, and/or a portable memory device, to name a few. The disclosed hanger device combines the functionality of a coat hanger and key holder with a remote access device, a portable memory device, and a laser pointer. The hanger device and key holder has a battery to feed the included electronic devices and a display to provide data and information related to the electronic devices.

Figure 1:
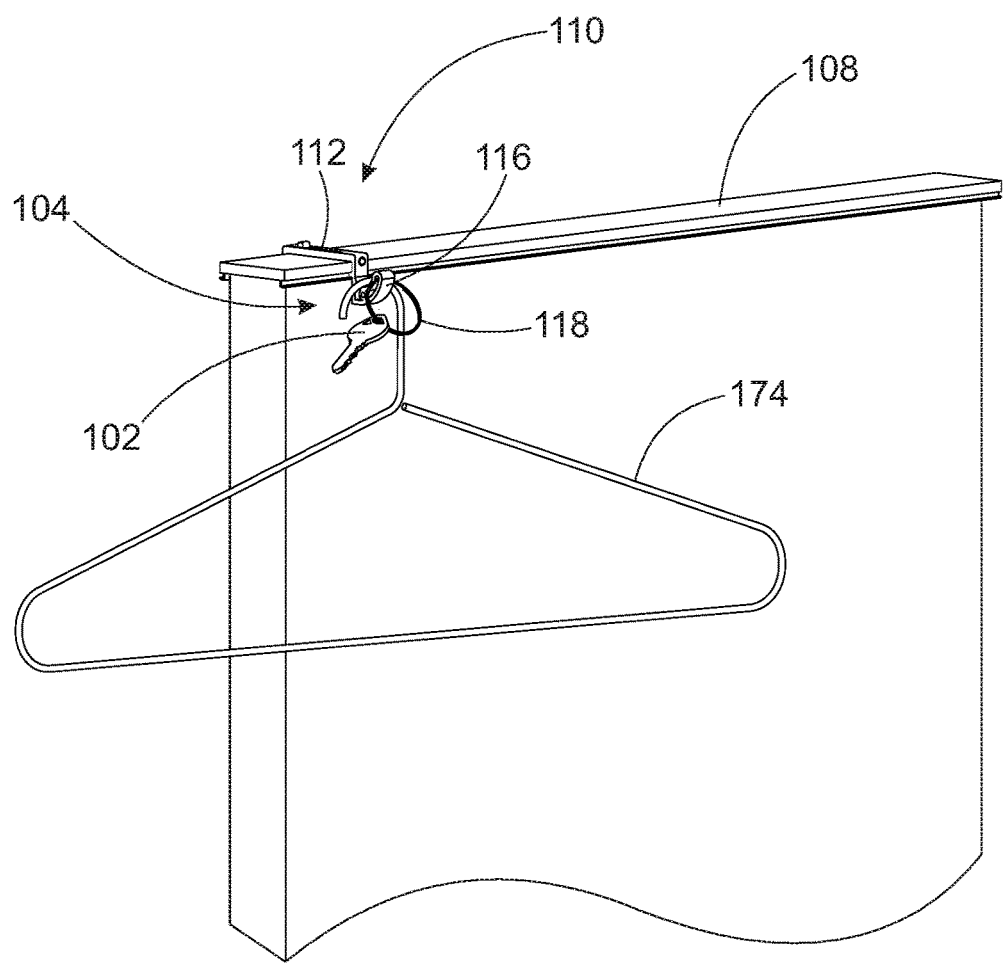
FIG. 1 shows a hanger device coupled to an office divider wall and holding a coat hanger and a key holder.
Figure 2:
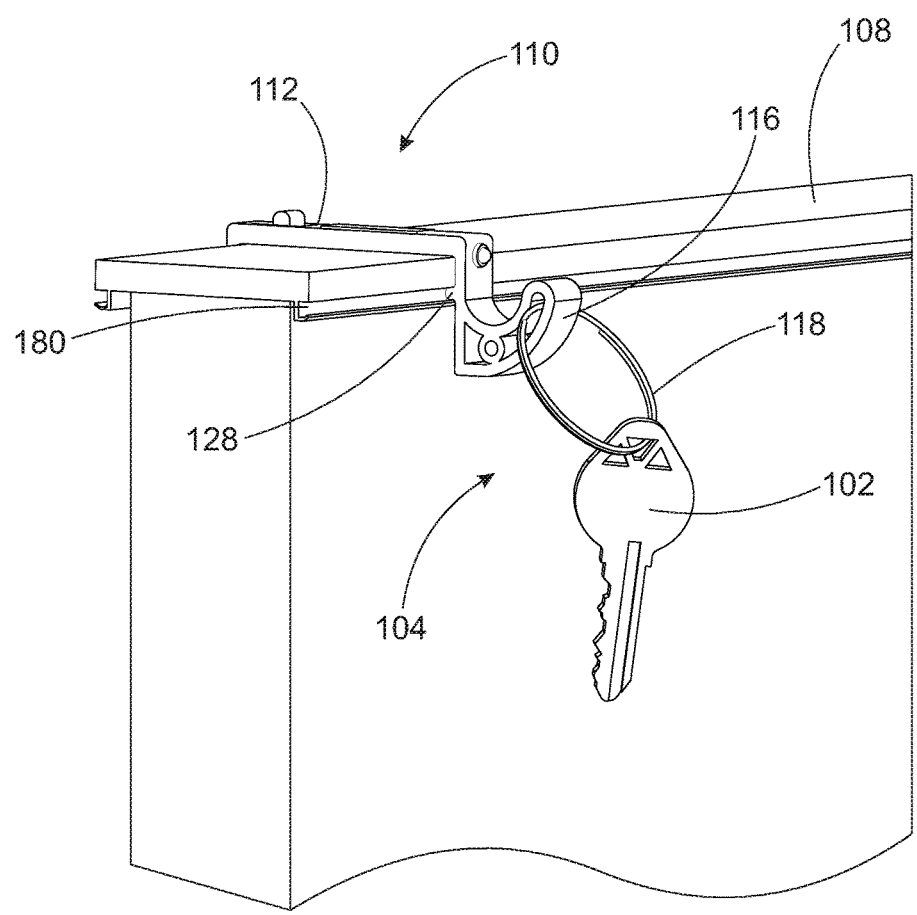
FIG. 2 shows a front close-up view of the hanger device of FIG. 1.
Figure 3:
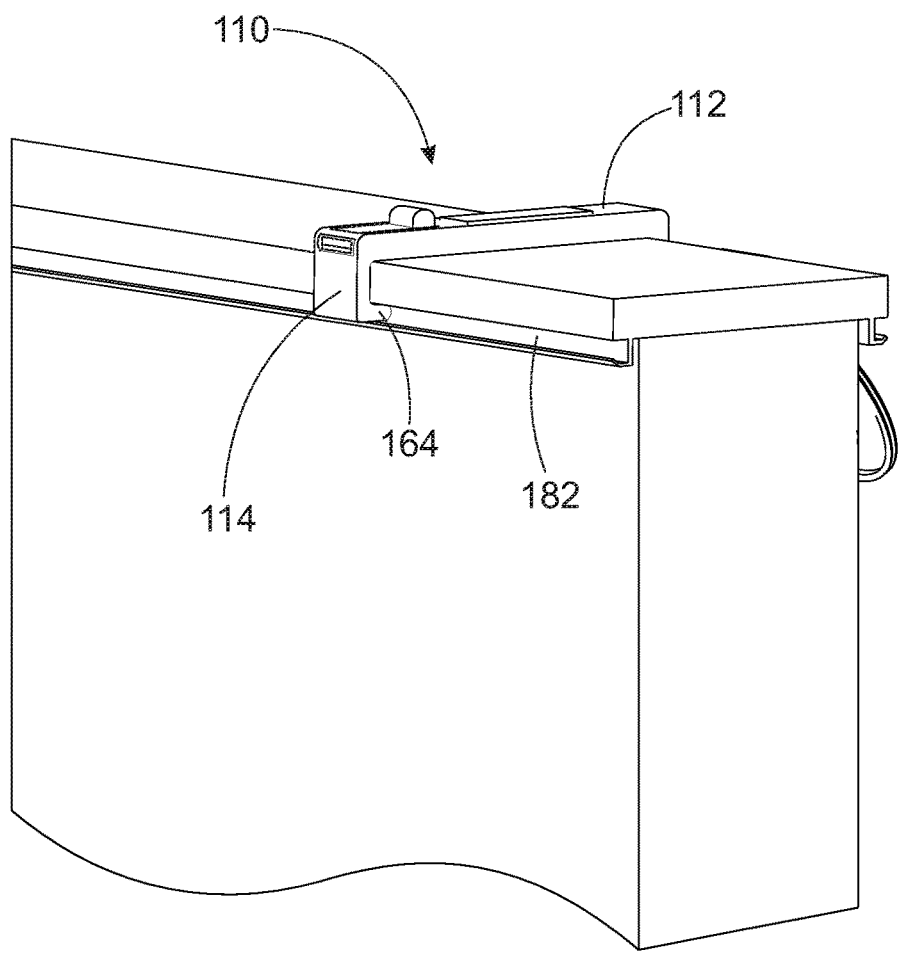
FIG. 3 shows a rear close-up view of the hanger device of FIG. 1.

FIG. 1 through FIG. 3 show a hanger device 110 coupled to a divider wall 108. Hanger device 110 is a coat hanger device in this embodiment, but this is not meant to be limiting. A key holder 104 is coupled to a hanger hook 116 of hanger device 110, in this embodiment. Divider wall 108 is an office environment divider wall such as is often used to enclose offices. FIG. 1 shows a front perspective view of hanger device 110 coupled to divider wall 108. FIG. 2 shows a front close-up view of hanger device 110 and key holder 104 coupled to divider wall 108. FIG. 3 shows a rear close-up view of hanger device 110 and key holder 104 coupled to divider wall 108. Key holder 104 includes key ring 118 and key 102. Key 102 and an L-shaped body 112 of hanger device 110 are each coupled to key ring 118 of key holder 104. Hanger device 110 includes L-shaped body 112, a coupling hook 114 (FIG. 3), and hanger hook 116. Coat hanger 174 is shown hanging from hanger hook 116 in FIG. 1. It is to be understood that divider wall 108 can take many different forms.

With hanger device 110 coupled to divider wall 108 as shown in FIG. 1 through FIG. 3, hanger device 110 can be used to hold coat hanger 174 and a jacket or coat, either with or without using coat hanger 174, for example. Key holder 104 is coupled to hanger device 110 to keep key 102 from getting lost. Hanger device 110 and key holder 104 includes other devices and capabilities as explained herein. Key holder 104 can be used to hold a number of keys on key ring 118, and hanger hook 116 can be used to hang apparel from or to hang coat hanger 174. Hanger device 110 is designed to be used in an office environment and to include items that office workers use regularly.

Figure 4:
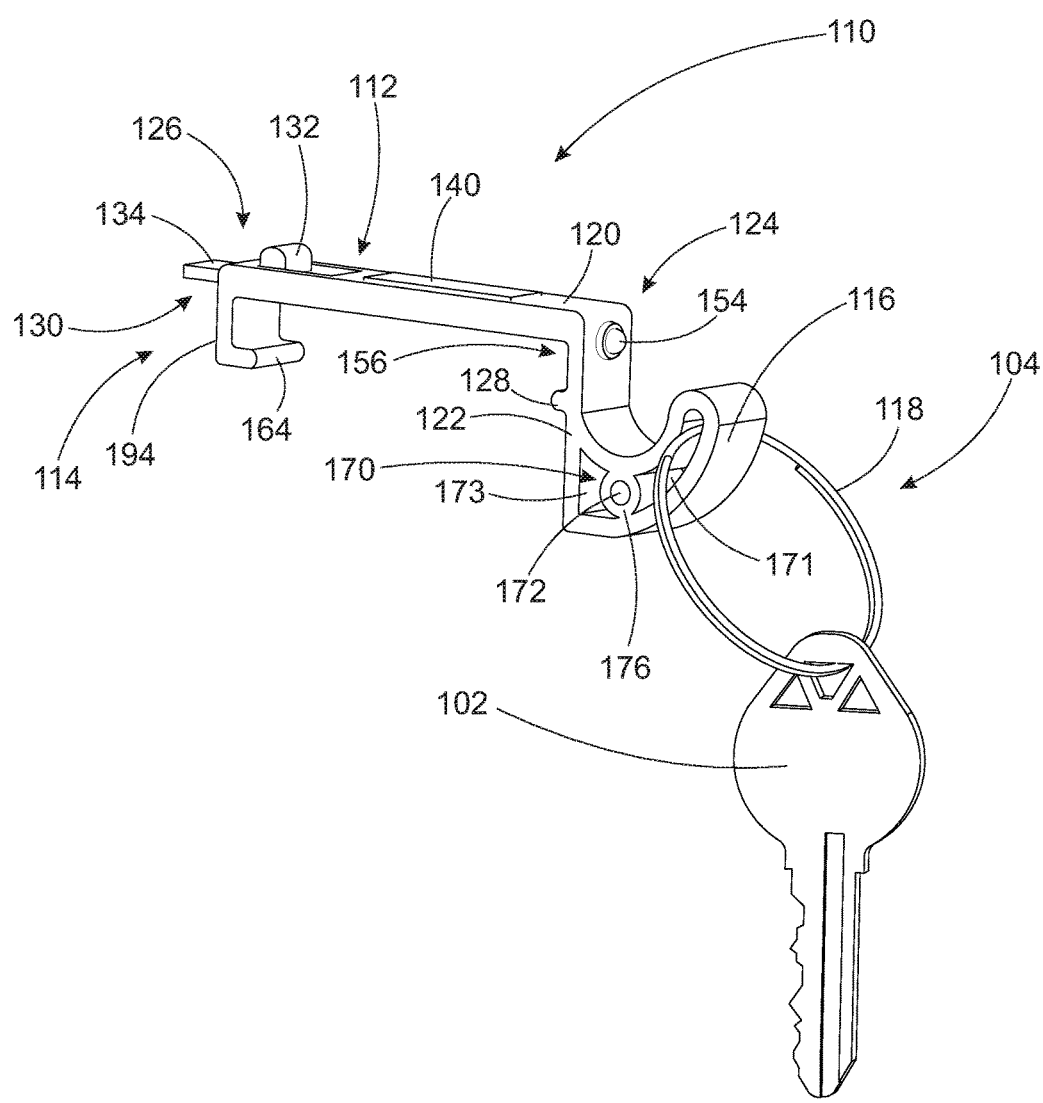
FIG. 4 shows a front perspective view of the hanger device of FIG. 1.
Figure 5:
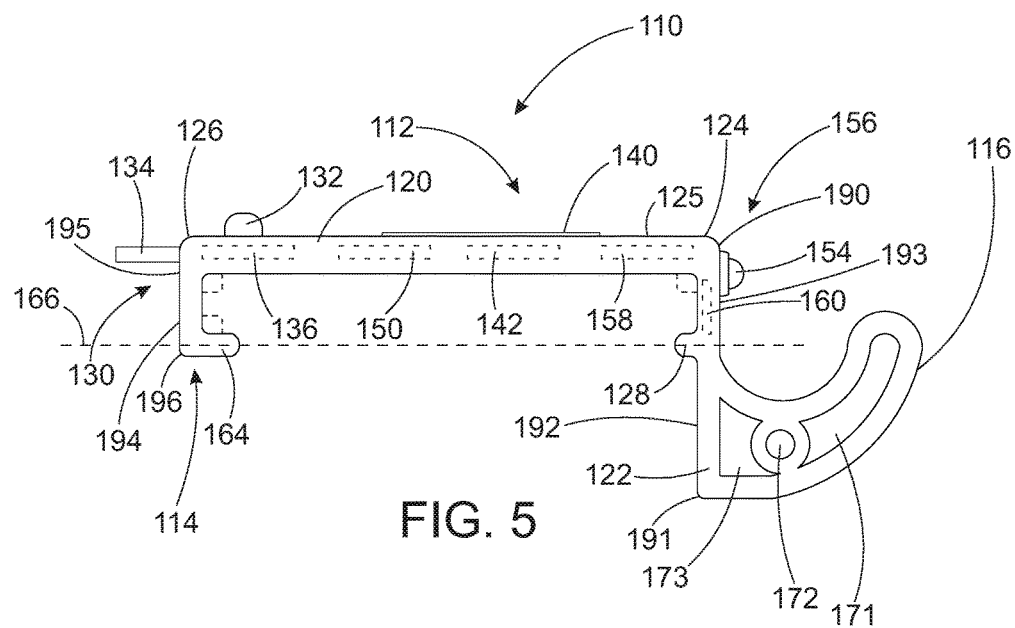
FIG. 5 shows a right side view of the hanger device of FIG. 1.
Figure 6:
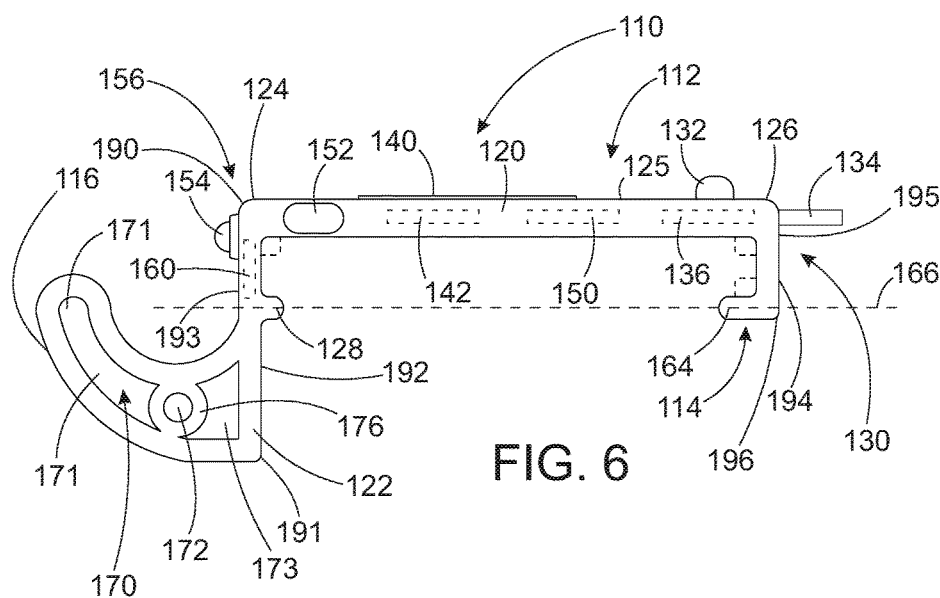
FIG. 6 shows a left side view of the hanger device of FIG. 1.
Figure 7:
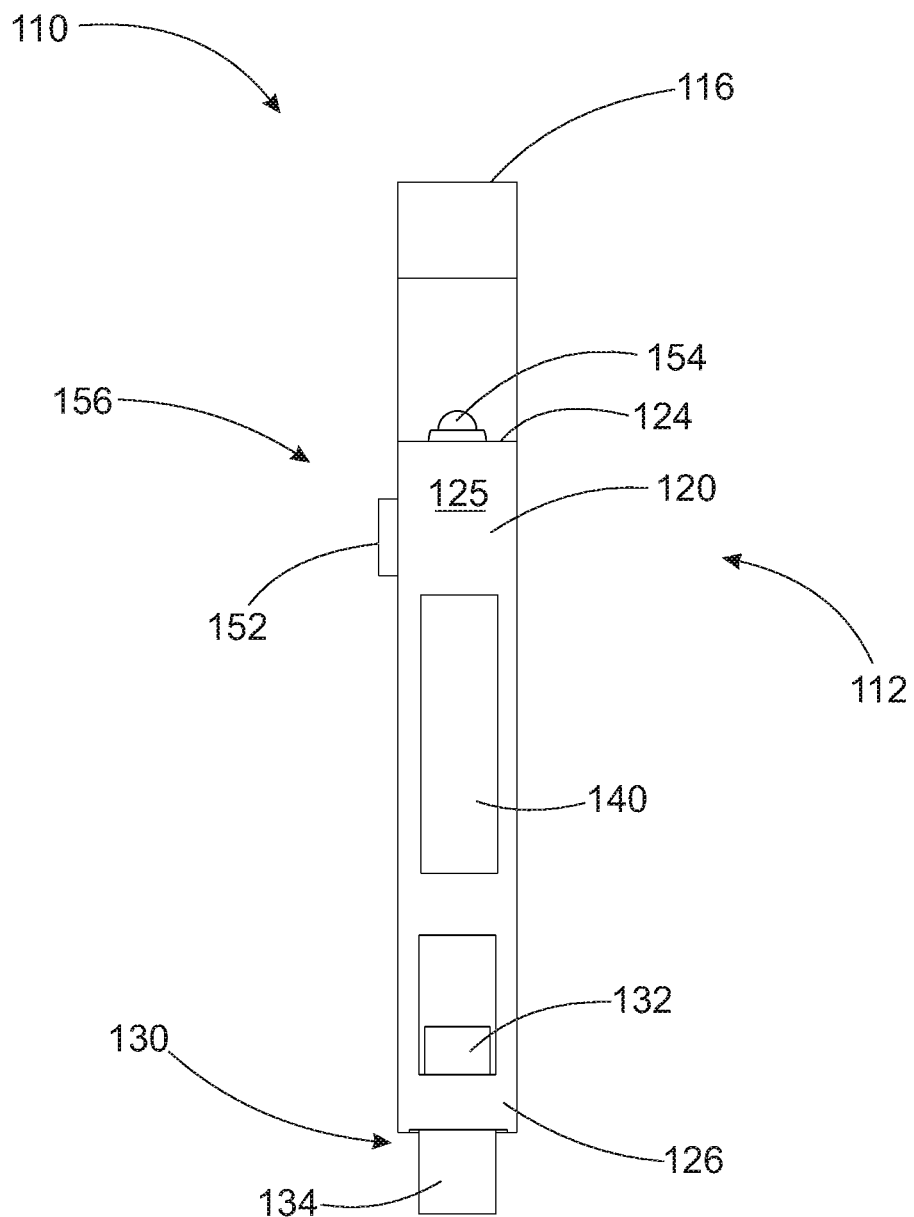
FIG. 7 shows a top view of the hanger device of FIG. 1.
Figure 8:
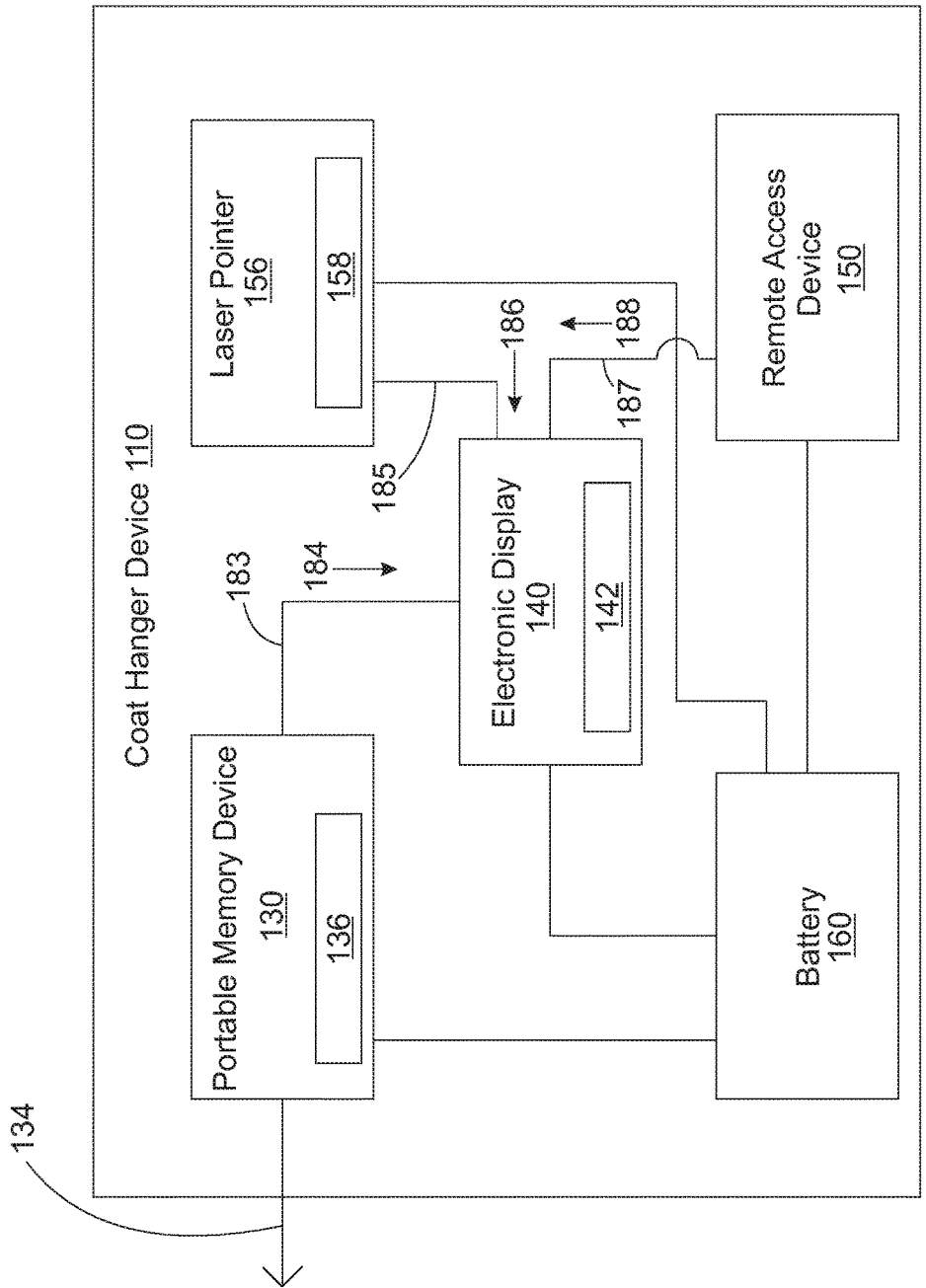
FIG. 8 shows a block diagram of the hanger device of FIG. 1.

FIG. 4 through FIG. 8 show additional details of hanger device 110. FIG. 4 shows a front perspective view of hanger device 110 and key holder 104. FIG. 5 shows a right side view of hanger device 110. FIG. 6 shows a left side view of hanger device 110. FIG. 7 shows a top view of hanger device 110, and FIG. 8 shows a simplified block diagram of hanger device 110.

Hanger device 110 includes L-shaped body 112, coupling hook 114 and hanger hook 116. L-shaped body 112 includes a stem section 120, which is the stem of the L of the L-shaped body. And L-shaped body 112 includes a leg section 122, which is the leg of the L of the L-shaped body. Stem 120 of L-shaped body 112 includes a stem first end 124, a stem second end 126 that opposes stem first end 124, and a stem top surface 125, see FIG. 4 through FIG. 7. Stem first end 124 is proximal to, and coupled to, leg section 122. Stem section 120 is straight bar of rigid or semi-rigid material, in this embodiment. Stem section 120 has a rectangular cross section in this embodiment, but this is not meant to be limiting.

Leg section 122 is a straight bar of rigid or semi-rigid material with a rectangular cross section, in this embodiment. Leg section 122 has a leg first end 190, a leg second end 191, a leg inner surface 192, and a leg outer surface 193, see FIG. 5 and FIG. 6. Leg section 122 is perpendicular to stem section 120 in this embodiment. Leg first end 190 is coupled to stem first end 124.

Coupling hook 114 is coupled to stem second end 126. Hanger hook 116 is coupled to leg outer surface 193 of leg section 122. Coupling hook 114 is used to couple hanger device 110 to divider 108, as shown in FIG. 1 through FIG. 3. Hanger hook 116 is a curved hook for hanging one or more coat, jacket, or coat hanger from, such as coat hanger 174 as shown in FIG. 1.

L-shaped body 112 is designed to couple to the top of office wall divider 108, as shown in FIG. 1 through FIG. 3. Coupling L-shaped body 112 to divider 108 keeps hanger device 110 in a known place, provides a place to hang coat hanger 174, and keeps key 102 available and in a known place. Hanger device 110 includes coupling hook 114 and coupling nib protrusion 128 (FIG. 4 through FIG. 6), both of which couple L-shaped body 120 to divider wall 108.

Coupling hook 114 has a coupling shank 194 and a coupling leg 164 coupled to coupling shank 194. Coupling shank 194 and coupling leg 164 are both bars of rigid or semi-rigid material with a rectangular cross section, in this embodiment. Coupling shank 194 has a coupling shank first end 195 and a coupling shank second end 196. Coupling shank first end 195 is coupled to stem second end 126, see FIG. 5 and FIG. 6. Coupling shank 194 is perpendicular to stem section 120. Coupling leg 164 is coupled to coupling shank second end 196. Coupling leg 164 is perpendicular to coupling shank 194. Coupling leg 164 provides the hook end of coupling hook 114 and helps couple hanger device 110 to divider wall 108, as best seen in FIG. 3.

Coupling nib protrusion 128 and coupling leg 164 are each short protrusions that fit into and grab onto divider wall slots 180 and 182 (FIG. 2 and FIG. 3) to couple hanger device 110 to divider wall 108. Coupling nib protrusion 128 extends from leg inner surface 192 of leg section 122 (FIG. 4, FIG. 5, and FIG. 6). Coupling leg 164 extends from coupling shank 194. Coupling nib protrusion 128 and coupling leg 164 both lie in a coupling plane 166 as shown in FIG. 5 and FIG. 6. Having coupling nib protrusion 128 and coupling leg 164 both lie in the same plane, coupling plane 166 in this embodiment, makes coupling nib protrusion 128 and coupling leg 164 line up with each other so they can each slide into one of the opposing divider wall slots 180 and 182 of divider wall 108. Coupling leg 164 can also be used to open bottles when hanger device 110 is not coupled to wall divider 108.

Hanger hook 116 is a curved hook that extends from leg outer surface 193 of leg section 122, and is used to hang items such as coat hanger 174 from, as shown in FIG. 1. Hanger hook 116 includes key holder slot 170, and key ring circular hole 172. Key holder slot 170 and key ring circular hole 172 are both openings that extend through hanger hook 116 and are used to couple key ring 118 of key holder 104 to hanger hook 116 and L-shaped body 112, see FIG. 4. Key holder slot 170 is an arc-shaped slot. Key ring circular hole 172 is a circular hole. Key ring circular hole 172 is defined by a circular wall 176 that is enclosed by key holder slot 170 and divides key holder slot 170 into two openings, a first opening 171 and a second opening 173, as shown in FIG. 4 through FIG. 6. Key ring 118 can be coupled to any of first opening 171, second opening 173, or key ring circular hole 172. Key ring 118 is coupled to first opening 171, second opening 173, or key ring circular hole 172 by extending key ring 118 through any of first opening 171, second opening 173, or key ring circular hole 172 in hanger hook 116. In the embodiment shown, key ring 118 of key holder 104 is coupled to hanger hook 116. In this embodiment, key ring 118 of key holder 104 extends through key holder slot 170, specifically through first opening 171 of key holder slot 170. In some embodiments, hanger hook 116 includes only key ring circular hole 172. In some embodiments, hanger hook 116 includes only arc-shaped key holder slot 170.

Hanger device 110 includes several other features and elements that make it useful to office workers. Hanger device 110 includes a portable memory device 130, a laser pointer 156, an electronic display 140, and a remote access device 150, as shown in FIG. 4 through FIG. 7, and in block diagram form in FIG. 8. Portable memory device 130, laser pointer 156, and remote access device 150 are all electronic devices that are in common use by office workers. Having them integrated into hanger device 110 make them readily accessible and helps keep them from getting lost or stolen.

Portable memory device 130 is coupled to stem section 120 of L-shaped body 112. Portable memory device 130 can be used to store and transport data in its memory. Portable memory device 130 can be a thumb drive or a flash drive, for example. Portable memory device 130 includes a portable memory device electronics 136, which is embedded in stem section 120 (see FIG. 5 and FIG. 6), a portable memory device switch 132 and a retractable connector 134, which are both partially embedded in stem section 120. Portable memory device electronics 136 includes the memory of portable memory device 130. In this embodiment, retractable connector 134 is a retractable universal serial bus (USB) connector. Portable memory device thumb switch 132 extends out of stem section 122 so that portable memory device thumb switch 132 can be used to extend or retract retractable connector 134. Retractable connector 134 extends from stem section 120 so that retractable connector 134 can be electrically coupled to a computer or other electronic device. In this embodiment, retractable connector 134 extends from stem second end 126 parallel to coupling plane 122 (FIG. 5 and FIG. 6), but this is not meant to be limiting.

Hanger device 110 also includes a battery 160 embedded in L-shaped body 112, as shown in FIG. 5, FIG. 6, and FIG. 8. In this embodiment, battery 160 is embedded in leg section 122. Battery 160 is electrically coupled to portable memory device 130 and provides power, if needed, to portable memory device 130.

Hanger device 110 also includes an electronic display 140. Electronic display 140 is coupled to stem section 120 in this embodiment (FIG. 4 through FIG. 7), but this is not meant to be limiting. In this embodiment, electronic display 140 is mounted to stem top surface 125. Electronic display 140 can be used to provide data and information regarding the several electronic devices contained within hanger device 110. In some embodiments, electronic display 140 can be programmed to provide data such as time and/or date, or other data which might be useful to a user. Electronic display 140 includes display drivers 142, which are embedded in stem section 120, as shown in FIG. 5 and FIG. 6. Electronic display 140 is a liquid crystal display in this embodiment, but this is not meant to be limiting. Electronic display 140 can be any type of display device that can display information that can be viewed by a user of hanger device 110.

In the embodiment shown in the figures, electronic display 140 is communicatively coupled to portable memory device 130 using a communication link 183, as shown in FIG. 8. Portable memory device 130 provides portable memory device information 184 to electronic display 140. Portable memory device information 184 can include many types of information relating to portable memory device 130. In this embodiment, portable memory device information 184 includes how much memory is used and how much memory is free on portable memory device 130. Electronic display 140 displays portable memory device information 184 for a user to view.

Hanger device 110 also includes laser pointer 156. Laser pointer 156 is enclosed in stem section 120 of L-shaped body 112, as shown in FIG. 5 and FIG. 6. Laser pointer 156 is used to generate laser light and is commonly used as an indicator during presentations and displays. Laser pointer 156 includes a laser pointer electronics 158, which includes the light generation elements and the electrical drive elements of laser pointer 156. Laser pointer electronics 158 is embedded in stem section 120, see FIG. 5 and FIG. 6. A laser output lens 154 outputs the laser light from laser pointer 156. Laser output lens 154 is coupled to leg outer surface 193 so that it is convenient to hold stem section 120 in the hand and point laser pointer 156. A laser pointer on/off button 152 (FIG. 6) turns the laser light on and off. Laser pointer 156 is communicatively coupled to electronic display 140 (see FIG. 8) using a communication link 185. Laser pointer 156 send laser pointer information 186 to electronic display 140. Laser pointer information 186 includes the on/off status of laser pointer 156, in this embodiment, and can include other type of laser pointer data. Electronic display 140 displays laser pointer information 186 for viewing.

Hanger device 110 also includes remote access device 150. Remote access device 150 is enclosed in stem section 120, as shown in FIG. 5 and FIG. 6. Remote access device 150 is used to remotely and electronically activate a door or a safe, for example but not by way of limitation. In this embodiment, remote access device 150 is embedded in stem section 120. Remote access device 150 can use radio frequency identification (RFID) or near field communication (NFC) for example, but not by way of limitation, to activate a lock or locking device. Remote access device 150 can be used to allow access to an individual to a secure area of a building, for example. Remote access device 150 can be used to control and activate many different types of doors, locks, and security devices. Remote access device 150 is communicatively coupled to electronic display 140 using a communication link 187, and sends remote access device information 188 to electronic display 140. Electronic display 140 displays remote access device information 188 for viewing. Remote access device information 188 includes a remote access code in this embodiment, but this is not meant to be limiting. Remote access device information 188 can include many different types of information regarding the status and activities of remote access device 150.

Battery 160 provides power to portable memory device 130, electronic display 140, laser pointer 156, and remote access device 150. In some embodiments, hanger device 110 includes other electronic components that receive power from battery 160.

Figure 9:
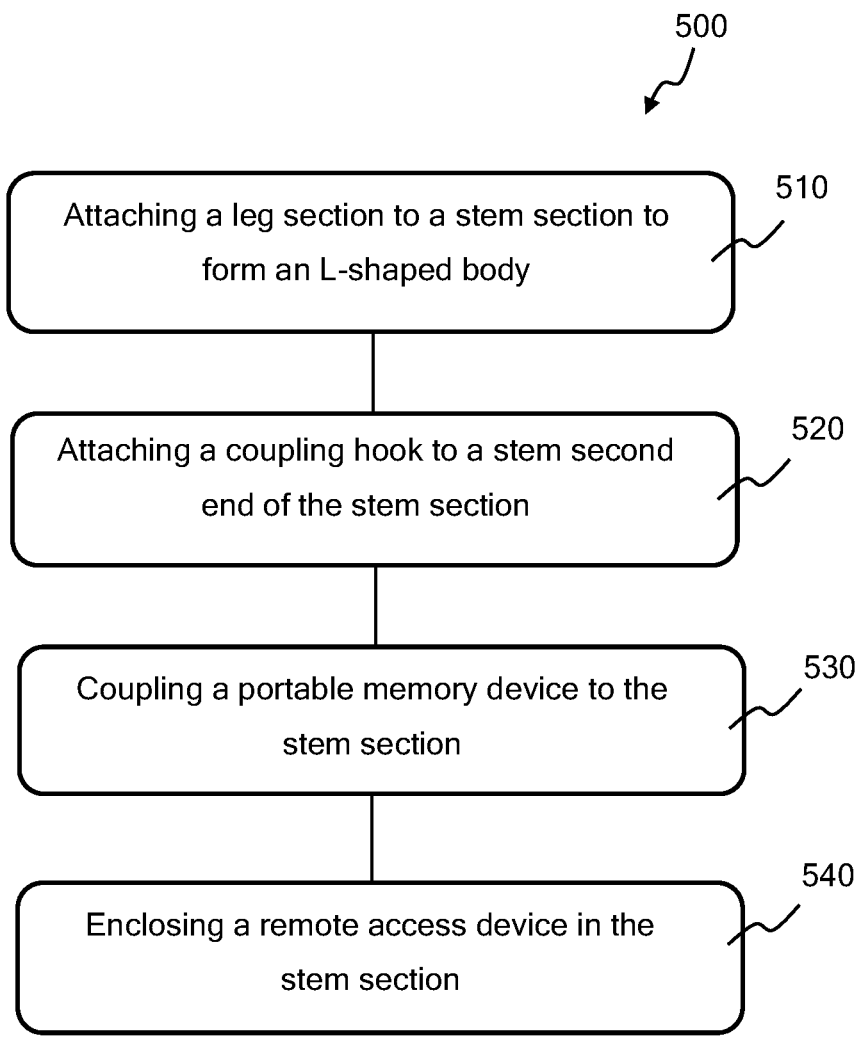
FIG. 9 illustrates a method of assembling a coat hanger device.

FIG. 9 illustrates a method 500 of assembling a hanger device. Method 500 includes an act 510 of attaching a leg section to a stem section to form an L-shaped body. Method 500 also includes an act 520 of attaching a coupling hook to a stem second end of the stem section. The coupling hook is configured to couple the hanger device to the top of a divider wall used to form an office in office buildings. In some embodiments, the coupling hook includes a coupling shank and a coupling leg. The coupling shank has a coupling shank first end coupled to the stem second end, and a coupling shank second end opposing the coupling shank first end. In some embodiments, the coupling shank is perpendicular to the stem section. The coupling leg is coupled to the coupling shank second end. In some embodiments, the coupling leg is perpendicular to the coupling shank.

Method 500 also includes an act 530 of coupling a portable memory device to the stem section, wherein a portable memory device connector extends from the stem second end. The portable memory device can be used to store data and electronic files, for example.

Method 500 also includes enclosing a remote access device in the stem section. The remote access device can be used to electronically allow access through a door or a storage locker, for example.

Method 500 can include many other acts. In some embodiments, method 500 includes coupling a hanger hook to a leg outer surface of the leg section. The hanger hook can be used to hang items from such as a coat hanger or a coat or a jacket, for example. In some embodiments, method 500 includes attaching a key holder to the hanger hook.

In some embodiments, method 500 includes enclosing a laser pointer in the stem section of the L-shaped body, where the laser pointer has a laser output lens coupled to a leg outer surface of the leg section. The laser pointer is used to shine laser light on presentations and whiteboards, for example.

In some embodiments, method 500 includes mounting an electronic display to the stem section, wherein the electronic display is communicatively coupled to the portable memory device, the remote access device, and the laser pointer.

A hanger device has been shown and described that is designed to be used by office workers. The hanger device couples to wall dividers often used to create office walls in office buildings. The hanger device includes an L-shaped body, a coupling hook that couples the L-shaped body to a divider wall, and a hanger hook. The hanger hook is configured to receive a key holder such as a key chain. The hanger device can be used to hold an office workers keys and can be used to hang a jacket or coat from. The hanger hook also has several other useful office devices integrated into the L-shaped body, such as a laser pointer, a portable memory device, a remote access device, and an electronic display.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above.

The invention claimed is:

1. A hanger device comprising:
   an L-shaped body comprising:
      a stem section having a stem first end, a stem second end, and a stem top surface;
      and
      a leg section having a leg first end, a leg second end, a leg inner surface and a leg outer surface, wherein the stem first end is coupled to the leg first end, and wherein the leg section is perpendicular to the stem section;
   a coupling hook coupled to the stem second end, wherein the coupling hook comprises:
      a coupling shank having a coupling shank first end coupled to the stem second end and a coupling shank second end opposing the coupling shank first end, wherein the coupling shank is perpendicular to the stem section; and a coupling leg coupled to the coupling shank second end, wherein the coupling leg is perpendicular to the coupling shank;

a hanger hook coupled to the leg outer surface;

a coupling nib protrusion coupled to the leg inner surface, wherein the coupling nib protrusion and the coupling leg both lie in a coupling plane;

a remote access device enclosed in the stem section; and a portable memory device coupled to the stem section, wherein the portable memory device comprises a retractable connector that extends from and retracts into the stem section, and wherein the retractable connector extends from the stem second end parallel to the coupling plane.

2. The hanger device of claim 1, wherein the stem section is straight.

3. The hanger device of claim 1, wherein the hanger hook is curved.

4. The hanger device of claim 1, further comprising an electronic display mounted to the stem top surface, wherein the electronic display is communicatively coupled to both the remote access device and the portable memory device.

5. The hanger device of claim 4, further comprising a laser pointer enclosed in the stem section.

6. The hanger device of claim 5, wherein the laser pointer comprises a laser output lens coupled to the leg outer surface.

7. The hanger device of claim 5, wherein the electronic display is communicatively coupled to the remote access device, the portable memory device, and the laser pointer.

8. The hanger device of claim 1, further comprising a key holder coupled to the hanger hook.

9. The hanger device of claim 8, wherein the key holder extends through a key holder slot in the hanger hook.

10. The hanger device of claim 1, wherein the hanger hook comprises a key holder slot and a key ring circular hole.

11. A method of assembling a hanger device comprising:
attaching a leg section to a stem section to form an L-shaped body;
attaching a coupling hook to a stem second end of the stem section;
coupling a portable memory device to the stem section, wherein a portable memory device connector extends from the stem second end; and
enclosing a laser pointer in the stem section of the L-shaped body, wherein the laser pointer comprises a laser output lens coupled to a leg outer surface of the leg section;
enclosing a remote access device in the stem section.

12. The method of claim 11, further comprising:
coupling a hanger hook to a leg outer surface of the leg section; and
attaching a key holder to the hanger hook.

13. The method of claim 11, wherein the coupling hook comprises:
a coupling shank having a coupling shank first end coupled to the stem second end and a coupling shank second end opposing the coupling shank first end, wherein the coupling shank is perpendicular to the stem section; and
a coupling leg coupled to the coupling shank second end, wherein the coupling leg is perpendicular to the coupling shank.

14. The method of claim 11, further comprising mounting an electronic display to the stem section, wherein the electronic display is communicatively coupled to the portable memory device, the remote access device, and the laser pointer.

* * * * *